(12) United States Patent
Cheng et al.

(10) Patent No.: US 12,194,510 B2
(45) Date of Patent: Jan. 14, 2025

(54) METHOD AND APPARATUS FOR SEMICONDUCTOR WAFER

(71) Applicant: Taiwan Semiconductor Manufacturing Company LTD, Hsinchi (TW)

(72) Inventors: Kuang-Wei Cheng, Hsinchu (TW); Cheng-Lung Wu, Miaoli (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/226,495

(22) Filed: Jul. 26, 2023

(65) Prior Publication Data

US 2024/0001409 A1 Jan. 4, 2024

Related U.S. Application Data

(62) Division of application No. 17/591,080, filed on Feb. 2, 2022.

(51) Int. Cl.
| | |
|---|---|
| H01L 21/67 | (2006.01) |
| B08B 3/02 | (2006.01) |
| B08B 3/04 | (2006.01) |
| H01L 21/02 | (2006.01) |

(52) U.S. Cl.
CPC .......... *B08B 3/02* (2013.01); *B08B 3/04* (2013.01); *H01L 21/02057* (2013.01); *H01L 21/67051* (2013.01); *B08B 2240/00* (2013.01)

(58) Field of Classification Search
CPC ......... B08B 3/02; B08B 3/04; B08B 2240/00; H01L 21/02057; H01L 21/31133; H01L 21/67051
See application file for complete search history.

(56) References Cited

U.S. PATENT DOCUMENTS

| | | | |
|---|---|---|---|
| 2002/0189638 A1* | 12/2002 | Luscher | H01L 21/67051 134/186 |
| 2003/0109205 A1* | 6/2003 | Sugimoto | H01L 21/02052 257/E21.228 |
| 2020/0102654 A1* | 4/2020 | Mizunaga | H01L 21/67259 |
| 2021/0391190 A1* | 12/2021 | Ohashi | H01L 21/68728 |

* cited by examiner

*Primary Examiner* — Erin F Bergner
(74) *Attorney, Agent, or Firm* — Lippes Mathias LLP

(57) ABSTRACT

A method of cleaning a semiconductor wafer includes: loading a semiconductor wafer into a cell having an annular trough; moving a plurality of nozzles into operational orientations for spraying a cleaning solution onto a top surface of the loaded semiconductor wafer; spraying the cleaning solution from each nozzle onto the top surface of the loaded semiconductor wafer in a direction defined by each nozzle's operational orientation such that a patterned flow of cleaning solution is formed on the top surface of the loaded semiconductor wafer; and collecting the cleaning solution in the annular trough of the cell as it flows off the top surface of the loaded semiconductor wafer.

20 Claims, 5 Drawing Sheets

METHOD AND APPARATUS FOR SEMICONDUCTOR WAFER

This application is a divisional application of U.S. application Ser. No. 17/591,080 filed Feb. 2, 2022 and now issued as U.S. Pat. No. 11,938,521, which claims the benefit of U.S. provisional application Ser. No. 63/280,217 filed Nov. 17, 2021 and titled "SLIM CELL APPARATUS AND METHOD FOR SEMICONDUCTOR WAFER CLEANING", which is incorporated herein by reference in its entirety.

BACKGROUND

The following relates to the semiconductor manufacturing arts, and in particular, to a method and apparatus for the cleaning of semiconductor wafers during the manufacturing of the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
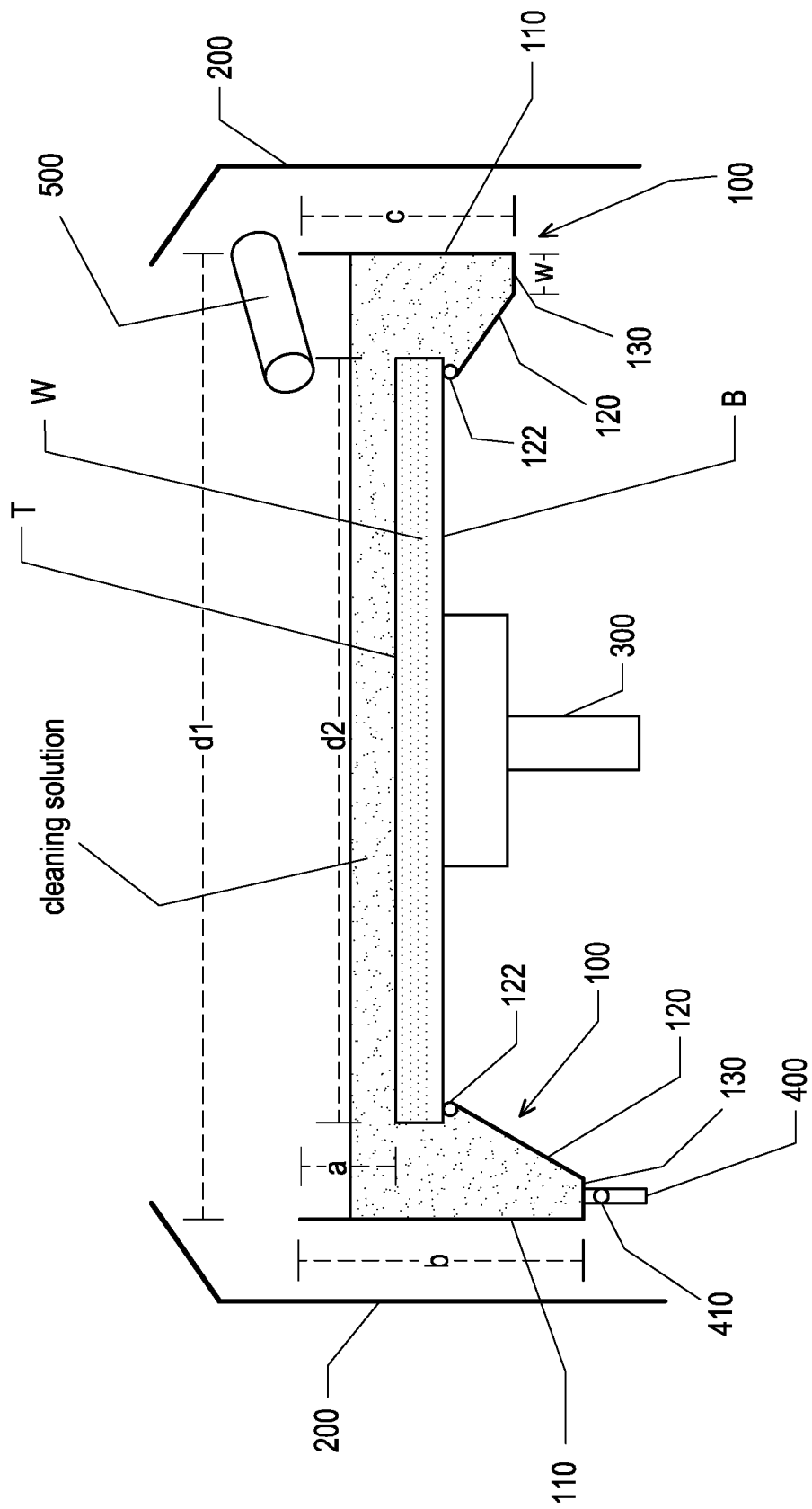
FIG. 1 diagrammatically illustrates a cross-section side view of an apparatus for cleaning a semiconductor wafer in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, some embodiments disclosed herein relate to a method and apparatus for cleaning a semiconductor wafer during the manufacture of the semiconductor wafer. For example, the cleaning may employ a photoresist stripper and be performed to strip photoresist and/or remove organic residue, as nonlimiting illustrative examples. In some embodiments, the semiconductor wafer to be cleaned is selectively placed atop and held on and/or by a pedestal during the cleaning process. While the semiconductor wafer is so positioned, an annular trough is disposed about an outer periphery of the semiconductor wafer. During the cleaning process, a plurality of nozzles, also disposed at or near the outer periphery of the wafer, jet or spray a cleaning solution across and/or over a top surface of the semiconductor wafer. As nonlimiting illustrative examples, sulfuric acid ($H_2SO_4$) or a sulfuric acid-based solution may be used as the cleaning solution in the case of photoresist stripping. As a specific nonlimiting example of the latter, the cleaning solution may be a Piranha solution, which is a mixture of sulfuric acid and hydrogen peroxide ($H_2O_2$), typically with a 3:1 to 4:1 $H_2SO_4:H_2O_2$ ratio. However, the choice of cleaning solution depends on the type of contamination, residue, or the like which is to be cleaned, and in other embodiments the cleaning solution may be deionized water (DI water), methanol (CH3OH), or so forth. In some embodiments, there are three or more such nozzles. In some embodiments, each nozzle may be selectively pointed or aimed in a desired direction so as to jet or spray the cleaning solution in that chosen direction.

Suitably, the nozzles are selectively positioned and/or aimed so that as the cleaning solution is jetted or sprayed from the nozzles it combines and collectively creates a desired pattern of cleaning solution flow on and/or over the top surface of the semiconductor wafer being cleaned. In some embodiments, the nozzles are positioned and/or aimed such that the resulting flow of cleaning solution on and/or over the top surface of the semiconductor wafer is in the form of a vortex or whirlpool or other like spinning or whirling type pattern. In some embodiments, the semiconductor wafer is held essentially stationary (e.g., non-rotating) on and/or by the pedestal during the cleaning process.

In some embodiments, the annular trough (also referred to at times herein as a slim cell) collects the cleaning solution as it flows over a periphery edge and/or off the top surface of the semiconductor wafer being cleaned. In some embodiments, the annular trough is relatively deeper at one or more locations compared to other locations so as to encourage the gathering of collected cleaning solution at these relatively deeper locations. In some embodiments, a drain is provided in fluid communication with at least one of these relatively deeper locations in the annular trough. In some embodiments, a valve is provided to selectively open and close the drain. In practice, when the valve is opened, the cleaning solution collected in and/or by the annular trough is drained therefrom, and conversely, when the valve is closed, the cleaning solution collected by the annular trough is retained and/or accumulates therein.

In some embodiments, the drain valve remains closed during the cleaning process so that the annular trough collects and retains the cleaning solution being jetted and/or sprayed from the nozzles. Suitably, while the cleaning process is applied to the semiconductor wafer, a sufficient volume of the cleaning solution is collected, accumulated and/or retained by the annular trough so that the top surface of the semiconductor wafer being cleaned becomes at least partially submerged in the cleaning solution during the cleaning process.

In some embodiments, at or near the end of the cleaning process, the nozzles cease jetting and/or spraying the cleaning solution therefrom, and the drain valve is opened to allow the cleaning solution collected by the annular trough to be drained therefrom through the drain. In some optional embodiments, the drained cleaning solution may be filter and collected to be reused or may simply be collected for safe disposal. The semiconductor wafer, cleaned accordingly, may be released and selective removed from the pedestal, for example, to undergo further processing as desired.

Advantageously, keeping the semiconductor wafer essentially immobile or stationary during the cleaning process helps guard against undesirable damage to features formed on the semiconductor wafer (for example, photoresist collapse) which might otherwise be potentially experienced by spinning the wafer at high revolutions per minute. Notably, in the illustrative embodiment the wafer does not rotate during the cleaning process; rather, the jetting or spraying provides desirable movement of the cleaning fluid over the surface of the wafer, rather than relying upon rotation of the wafer to impart this relative movement of the cleaning fluid respective to the wafer surface.

Additionally, constraining the cleaning solution to within a slim cell which is relatively smaller than a conventional chamber of a cleaning apparatus, has the advantage of potentially using less cleaning solution during a given cleaning procedure, for example, up to or greater than a 70% cleaning solution savings can be potentially realized compared with a cleaning apparatus in which the wafer is dipped and immersed in a chemical dip comprising a cleaning solution. With some other chemical dip methods and/or apparatus for cleaning semiconductor wafers, up to or greater than 90% of the cleaning chemicals are potentially wasted, for example, without contacting the photoresist or other residue to be cleaned from the wafer. The wasting of cleaning chemicals during a semiconductor cleaning process can be environmentally unfriendly and unnecessarily increase the manufacturing cost of semiconductor devices. One potential advantage of some embodiments disclosed herein is the saving and/or more efficient usage of cleaning chemicals.

With reference now to FIG. 1, there is diagrammatically shown a cross-section view of an exemplary semiconductor wafer cleaning apparatus 10 in accordance with aspects of some embodiments disclosed herein. As shown, an inner annular trough (also referred to herein as a slim cell) 100 is contained, disposed and/or supported in a chamber defined by an outer housing 200 of the cleaning apparatus 10. In practice, a pedestal 300 is also contained and/or disposed in the chamber defined by the outer housing 200 of the cleaning apparatus 10. As shown, the pedestal 300 is centrally located with respect to the slim cell 100. In some embodiments, the pedestal 300 includes a vacuum chuck, electrostatic chuck, or the like which secures and/or otherwise holds a semiconductor wafer W which is selectively placed thereupon during a cleaning process applied to the semiconductor wafer W with the cleaning apparatus 10. In some embodiments, the semiconductor wafer W is secured and/or held essentially stationary and/or immobile on and/or by the pedestal 300 during the cleaning process. For example, in some such embodiments, the pedestal 300 is a non-rotatable pedestal. By comparison, some cleaning systems include a single nozzle directing cleaning solution downward onto the center of the wafer in conjunction with a rotatable pedestal that rotates the semiconductor wafer about its axis during the cleaning process in order to impart movement and swirling flow of the cleaning fluid outward across the surface of the wafer. As recognized herein, such rotation of the wafer can produce deleterious effects such as producing outward centrifugal force on patterned photoresist, three-dimensional (3D) device structures, or the like, potentially leading to photoresist collapse or other types of damage. Furthermore, rotation of the wafer at high speed to impart high velocity flow of the cleaning fluid across the wafer surface can lead to the wafer disengaging from the vacuum chuck, resulting in shattering or other damage to the wafer. By contrast, by jetting or spraying cleaning solution over the surface of a stationary wafer, as in some embodiments disclosed herein, imparts the desired velocity (and optionally high velocity) flow of the cleaning fluid over the wafer without rotating the wafer about its axis. This reduces likelihood of photoresist collapse and eliminates the possibility of spinning the wafer off of a rotating mount.

As shown in FIG. 1, the slim cell 100 includes an outer vertical wall 110, an inner sloped wall or lip 120 and a bottom base 130. The outer vertical wall 110 suitably forms a cylindrical shape of sufficient diameter d1 to accommodate a semiconductor wafer W (for example, having a diameter d2 sufficiently less than d1) which is selectively positioned atop and held by the pedestal 300. In practice, the diameter d2 of the semiconductor wafer W may be about 300 mm, and the diameter d1 of the slim cell 100 may be between greater than about 300 mm and less than about 400 mm. In some embodiments, trough diameter d1 is greater than wafer diameter d2 (d1>d2) and the ratio d1/d2 is less than or equal to 1.5 (that is, $$\frac{d1}{d2} \leq 1.5).$$

In practice, to accommodate semiconductor wafers having diameters of other sizes or dimensions, the diameter or dimensions of the slim cell 100 may similarly be modified or altered accordingly.

In practice, the pedestal 300 and slim cell 100 are arranged and/or positioned with respect to one another such that a top of the outer vertical wall 110 of the slim cell 100 rises above a top surface T of the semiconductor wafer W (for example, by an amount a) when the semiconductor wafer W is positioned atop and held on the pedestal 300. The outer vertical wall 110 thus retains the cleaning solution within the slim cell 100. As can be seen in FIG. 1, the volume of cleaning fluid is low as it extends over the surface of the wafer and slightly beyond (up to the outer vertical wall 110. By comparison, a chemical dip typically uses a substantially larger volume of cleaning fluid.

As shown in FIG. 1, the base 130 is formed at and extends radially inward from a bottom end of the cylindrical vertical wall 110. In practice, the base 130 connects to the bottom end of the cylindrical vertical wall 110 and establishes and/or defines a bottom or floor of the trough or slim cell 100. In some suitable embodiments, the floor or base 130 has a width w of between about 10 mm and about 50 mm.

As further shown in FIG. 1, the inner wall or lip 120 of the slim cell 100 further extends radially inward from the base 130 and is sloped upward from the base 130 toward a bottom surface B of the semiconductor wafer W which is selectively positioned atop and held by the pedestal 300. The bottom surface B of the semiconductor wafer W is sometimes referred to as the backside of the wafer.

In some embodiments, an o-ring or other like sealing gasket 122 is disposed along an upper end of the inner lip 120. When the semiconductor wafer W is positioned atop and held by the pedestal 300, the o-ring or sealing gasket 122 suitably provides a substantially liquid-tight and/or fluid-tight seal between the bottom surface B of the semiconductor wafer W and the upper end of the inner wall or lip 120. In practice, the vacuum chuck or other like holding mechanism employed by the pedestal 300 suitably imparts a downward pressure or force on the semiconductor wafer W to ensure good contact and/or a good seal with the o-ring or gasket 122, for example, squeezing the o-ring or gasket 122 between the bottom surface B of the semiconductor wafer W and the upper end of the inner lip 120 which contacts the o-ring or sealing gasket 122. In practice, the o-ring or gasket 122 may be made from a suitably anti-corrosive material. In some exemplary embodiments, the o-ring or gasket 122 is made from a fluoroelastimer or fluoro-rubber material (for example, FPM (ASTM International Standard D1418), FKM (ISO 1629), Viton™, etc.) or other like materials.

The use of the annular trough 100 advantageously eliminates contact with the backside of the semiconductor wafer W with the cleaning fluid except possibly at a thin outer annulus of the backside of the wafer W extending outboard of the sealing gasket 122. However, it is contemplated for the trough to have other geometries. For example, in another contemplated embodiment, the trough may extend to and connect with the pedestal 300. This may provide a more rigid structural arrangement and be acceptable if contact of the cleaning fluid with the backside of the wafer is acceptable. In such an alternative embodiment, the gasket 122 is suitably omitted.

In some embodiments, the slim cell 100 is relatively deeper at one or more locations compared to other locations so as to encourage the gathering of collected cleaning solution at these relatively deeper locations. For example, as shown in FIG. 1, a depth b of the vertical wall 110 on one side of the slim cell 100 (i.e., the left side in this case) is greater than a depth c of the vertical wall 100 on another side of the slim cell 100 (i.e., the right side in this case). Accordingly, the cleaning solution collected by the slim cell 100 will tend to flow toward and gather at the relatively deeper location within the trough (i.e., near that location of the vertical wall 110 having the relatively greater depth b as opposed to near that location of the vertical wall 110 having merely the relatively lesser depth c). In some suitable embodiments, the dimension b may be between about 5 mm and about 100 mm and the dimension c may be between about 5 mm and about 100 mm, where b is generally greater than c.

Figures 2A, 2B, 2C:
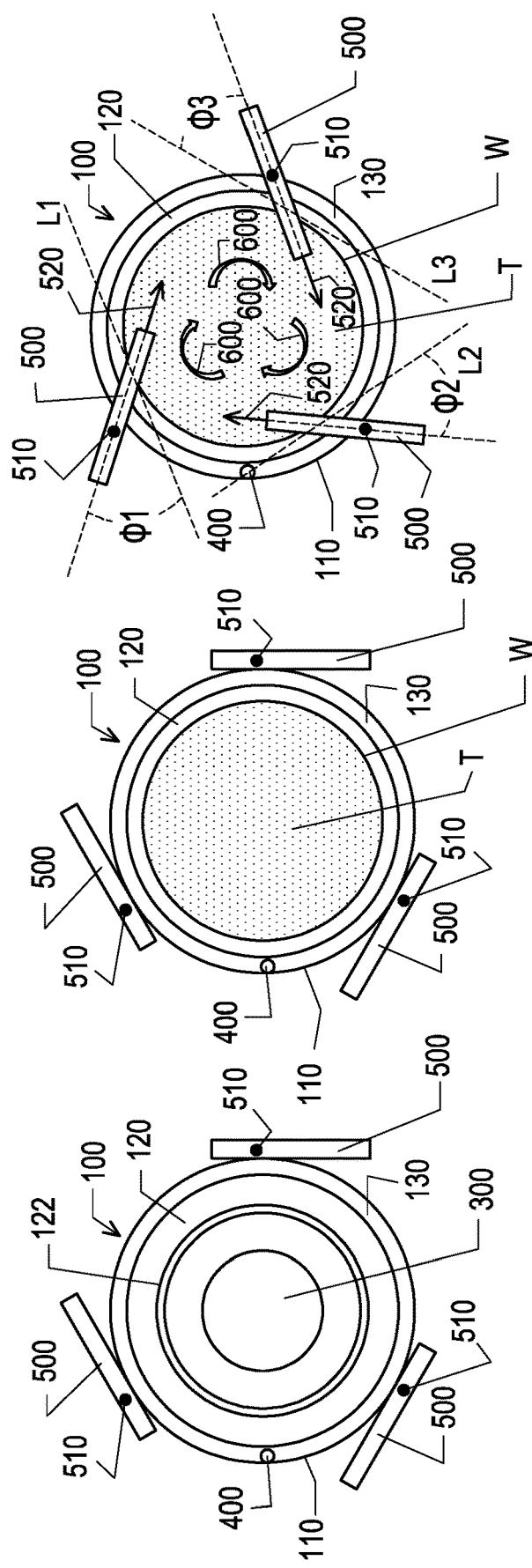
FIGS. 2A through 2C diagrammatically illustrate partial top views of the cleaning apparatus shown in FIG. 1 at various stages of a cleaning process carried out thereby.

As shown in FIG. 1, at least one drain 400, for example, such as a tube or pipe or the like, is provided in fluid communication with the trough of the slim cell 100. Suitably, the drain 400 is positioned and/or situated to be in fluid communication with the slim cell 100 at or near the relatively deeper portion of the slim cell 100, i.e., at or near where the vertical wall 110 extends to the relatively greater depth b as opposed to at or near where the vertical wall 110 merely extends to the relatively lesser depth c. In some embodiments, a drain valve 410 is provided to selectively open and close the drain 400. In practice, when the valve 410 is opened, the cleaning solution collected in and/or by the slim cell 100 is drained therefrom via the drain 400, and conversely, when the valve 410 is closed, the cleaning solution collected by the slim cell 100 is retained and/or accumulates therein. In some embodiments, the drain valve 400 is automated to selectively open and close in accordance with the operation of a suitably driven actuator, for example, an electric motor, an electromechanical, pneumatic, or hydraulic piston, etc. In some embodiments, the automated operation of the valve 400 is regulated by a controller in accordance with a preset or otherwise established cleaning process that the controller is programmed or otherwise instructed to carry out and/or apply with the cleaning apparatus 10. In alternative embodiments, the drain valve 400 may be manually open and/or closed selectively as desired. In yet other alternative embodiments, the drain may be always-open (i.e., with no valve, just configured as an opening). In this case, the flow rate of the cleaning fluid should be sufficient that it maintains the desired residence time of cleaning fluid on the top surface of the wafer W while continuously draining from the slim cell 100. For example, the fluid flow resistance imposed by such an always-open (i.e. unvalved) drain may be high enough to cause the volumetric fluid drain rate to be smaller than the volumetric fluid delivery rate. The drain 400 may feed into a waste storage container (e.g., optionally containing a neutralizing agent if the cleaning solution comprises $H_2SO_4$ or another strong acid), or into a recycling container (if the cleaning solution is to be reused for subsequent cleaning operations), or the like In some embodiments, a plurality of nozzles 500 are also contained and/or otherwise disposed within the chamber defined by the outer housing 200 of the cleaning apparatus 10. While only one such nozzle 500 is shown in FIG. 1 for the sake of simplicity, in practice, a plurality of nozzles 500 (that is, two or more nozzles) are likewise disposed at selected positions within the chamber defined by the outer housing 200 of the cleaning apparatus 10. Suitably, three nozzles 500 are provided in the chamber at various locations about the slim cell 100, for example, as shown in FIGS. 2A through 2C. In some embodiments, more than three nozzles 500 are provided. In some suitable embodiments, the nozzles 500 are positioned so as to be at or near a periphery of the semiconductor wafer W when the semiconductor wafer W is positioned atop and/or held by the pedestal 300. In some suitable embodiments, the nozzles 500 are arranged to be equally or nearly equally spaced around a circumference of the semiconductor wafer W when the semiconductor wafer W is positioned atop and/or held by the pedestal 300.

In practice, each nozzle 500 is in fluid communication (for example, via a flexible tube or the like) with a suitable supply of cleaning solution. For example, in the case of photoresist stripping and/or removal of organic residue, the supplied cleaning solution may be a solution of sulfuric acid ($H_2SO_4$), hydrofluoric acid (HF) or other suitable semiconductor cleaning solution. In other embodiments, the cleaning solution may be deionized (DI) water, methanol ($CH_3OH$), or another chemical or chemical solution chosen for effectiveness in cleaning the intended contamination, residue, or so forth from the wafer surface. Suitably, each nozzle 500 is configured to selectively jet or spray the supplied cleaning solution from an operative end of the nozzle 500. In some embodiments, the nozzles 500 are automated to selectively jet or spray cleaning solution therefrom in accordance with the operation of a suitable mechanism, for example, such as a pump or the like which flows the cleaning solution to and/or through the nozzles 500. In some embodiments, the automated operation of the nozzles 500 is regulated by a controller in accordance with a preset or otherwise established cleaning process that the controller is programmed or otherwise instructed to carry out and/or apply with the cleaning apparatus 10. In alternative embodiments, the nozzles 500 may be manually operated and/or controlled selectively as desired.

With added reference to FIGS. 2A through 2C and continuing reference to FIG. 1, in some embodiments, each nozzle 500 is arranged to be selectively pivoted about an axis 510. At the start of the cleaning process or prior thereto, the nozzles 500 are initially pivoted to or otherwise retained in a starting position or orientation, for example, as shown in FIG. 2A. In this starting position or orientation, the operative end of each nozzle 500 (i.e., the end from which the cleaning solution is jetted or sprayed out of the nozzle 500) is located and/or maintained outside or substantially outside an outer periphery of the slim cell 100, for example, outside of the outer vertical wall 110, so that the nozzles 500 (and in particular the operative ends thereof) do not interfere with or block the loading of the semiconductor wafer W into the slim cell 100. That is to say, with the nozzles 500 oriented as shown in FIG. 2A, the semiconductor wafer W may be selectively lowered or loaded from the top down into the slim cell 100 and placed atop the pedestal 300 without substantial interference from the nozzles 500 or the operative ends thereof.

FIG. 2A shows the slim cell 100 with the nozzles 500 in their starting or initial orientations and without the semiconductor wafer W loaded in the slim cell 100. FIG. 2B shows the slim cell 100 with the nozzles 500 in their starting or initial orientations and the semiconductor wafer W loaded into the slim cell 100 and placed atop the pedestal 300. The loading of the wafer W may also entail turning on a vacuum chuck, electrostatic chuck, or other securing mechanism of the pedestal 300 to secure the semiconductor wafer W on the pedestal 300. FIG. 2C shows the slim cell 100 with the semiconductor wafer W loaded therein and placed atop the pedestal 300 and with the nozzles 500 having been pivoted to their operative orientations subsequent to loading of the semiconductor wafer W into the slim cell 100. As shown in FIG. 2C, the operative ends (i.e. nozzle outlets) of the nozzles 500 are pivoted into positions over and/or above the top surface T of the semiconductor wafer W which had been previously loaded into the slim cell 100 and/or placed atop the pedestal 300 while the nozzles 500 where in their initial or starting orientations (for example, as shown in FIGS. 2A and 2B).

In some embodiments, during the cleaning process while the nozzles 500 have been pivoted into their operative orientations as shown in FIG. 2C, each nozzle 500 is operated to jet or spray the supplied cleaning solution across and/or over a top surface T of the semiconductor wafer W, generally in a direction of the corresponding arrow 520 extending from the operative end of the respective nozzle 500. That is to say, the corresponding arrows 520 generally indicate the direction in which each respective nozzle 500 is aimed.

In some embodiments, when in operation, each nozzle 500 is selectively pointed or aimed in a desired direction so as to jet or spray the supplied cleaning solution in that chosen direction. Suitably, in practice, the nozzles 500 are selectively positioned and/or aimed (for example, as shown in FIG. 2C) so that as the supplied cleaning solution is jetted or sprayed from the nozzles 500 it combines and collectively creates a desired pattern of cleaning solution flow on and/or over the top surface T of the semiconductor wafer W being cleaned. In some embodiments, the nozzles 500 are positioned and/or aimed such that the resulting flow of cleaning solution on and/or over the top surface T of the semiconductor wafer W is in the form of a vortex or whirlpool or other like spinning or whirling type pattern (for example, as generally indicated by the arrows 600). In the illustrative example, each of the illustrative three nozzles 500 is oriented to contribute to the whirling or rotational flow pattern 600 which rotates in a clockwise rotation as seen from above in FIG. 2C. Alternatively, the nozzles could be oriented to contribute to a counterclockwise whirling or rotational flow pattern (again, as seen from above). In some embodiments, the semiconductor wafer W is held essentially stationary on and/or by the pedestal 300 (e.g., non-rotating) during this portion and/or step of the cleaning process (and indeed over the entire process in some embodiments, e.g. as previously noted the pedestal 300 may be non-rotatable in some embodiments).

In some embodiments, when in their operational orientations (for example, as shown in FIG. 2C), the direction each nozzle 500 is aimed makes an angle $\phi$ with respect to a line tangential to the circumference or periphery of the semiconductor wafer W at the location thereabout corresponding to where the nozzle 500 is positioned. More specifically, as shown in FIG. 2C, one of the nozzles 500 is aimed at an angle $\phi 1$ with respect to the tangent line L1, another one of the nozzles 500 is aimed at an angle $\phi 2$ with respect to the tangent line L2, and yet another one of the nozzles 500 is aimed at an angle $\phi 3$ with respect to the tangent line L3.

In some suitable embodiments, $\phi 1 \neq \phi 2$ or $\phi 3$; and in some alternative embodiments $\phi 1 \neq \phi 2 \neq \phi 3$. Having the nozzles 500 aimed at differing angles thusly tends to help in more evenly distributing a rotational or other flow velocity of the cleaning solution on and/or over the top surface T of the semiconductor wafer W so that it is not unduly concentrated at a given radius, thereby promoting a more uniform cleaning by the flow pattern of the cleaning solution on and/or over the top surface T of the semiconductor wafer W. Also, as seen in FIG. 1, each nozzle 500 may be tilted downward to direct the jetting or spraying at a downward angle determined by the downward tilt of the nozzle. Still further, in some embodiments the width of the nozzle jet or spray output by each nozzle 500 can be adjusted using an adjustable nozzle aperture, or by providing different nozzle aperture caps with different aperture sizes and installing the aperture cap providing the desired narrow-angle or wide-angle spray. In some embodiments, these various parameters or a subset thereof (e.g., the angles $\phi$, downward angle of the nozzles, flow rates of the output fluid jets and narrow or broad jet) for producing a desired whirling flow pattern 600 can be determined manually based on test runs on test semiconductor wafers, and/or based on fluid flow modeling using finite element modeling or the like. In the latter case, inputs to the fluid flow modeling may include, for example, flow velocity out of the nozzles 500, the viscosity of the cleaning solution, drag of the cleaning fluid on the surface of the wafer W, and so forth.

The semiconductor wafer cleaning apparatus thus includes a synergistic combination of the slim cell 100 which provides a relatively low volume of cleaning solution in contact with the surface of the wafer W, and the nozzles 500 which apply that low volume of cleaning solution in a swirling pattern onto the surface of the wafer W to enhance the interaction between the cleaning solution and the wafer surface to provide effective cleaning with a low volume of cleaning solution.

In some suitable embodiments, the selective pivoting and/or movement of each nozzle 500 about its axis 510 and the selective jetting or spraying of cleaning solution from the operative end thereof is automatically controlled in accordance with the operation of a suitably driven mechanism or actuator, for example, a pump, an electric motor, an electromechanical, pneumatic, or hydraulic piston, etc. In some embodiments, the automated operation of the nozzles 500 is regulated by a controller in accordance with a preset or otherwise established cleaning process that the controller is programmed or otherwise instructed to carry out and/or apply with the cleaning apparatus 10. In alternative embodiments, the nozzles 500 may be manually open and/or closed selectively as desired.

Figure 3:
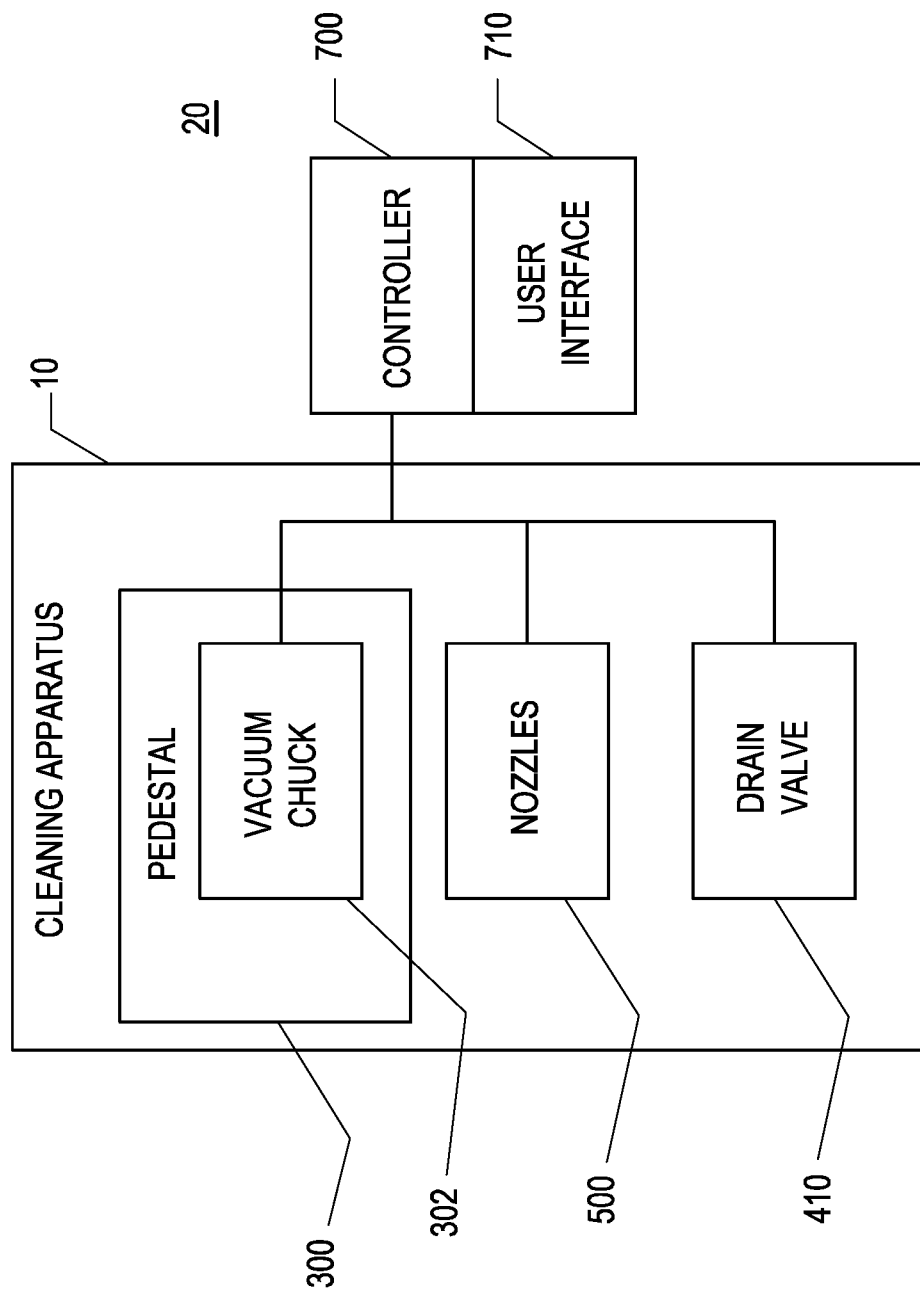
FIG. 3 diagrammatically illustrates a semiconductor wafer cleaning system, for example, employing the cleaning apparatus shown in FIG. 1.

With reference to FIG. 3, a semiconductor wafer cleaning system 20 is shown which incorporates the cleaning apparatus 10. As shown in FIG. 3, selected components of the cleaning apparatus 10 including the pedestal 300 (and in particular the vacuum chuck 302 incorporated therein), nozzles 500 and drain valve 400 are shown to be controlled and/or monitored by a controller 700.

Suitably, the controller 700 may be implemented via hardware, software, firmware or a combination thereof. In particular, the controller 700 may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying the controller 700 may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

As shown, the controller 700 is provisioned with a user interface 710, including one or more suitable input and/or output devices, for example, such as a touchscreen or other display, keyboard, mouse, etc. Via the user interface 710, an operator may direct control of the cleaning apparatus 10 as desired, as well as obtain information and/or data from the cleaning apparatus 10, for example, such as the current operational state of the various components controlled by the controller 700.

In some embodiments, the selective engagement and disengagement of the pedestal's vacuum chuck 302 is controlled and/or monitored by the controller 700. For example, the controller 700 may selectively energize or otherwise regulate operation of a suitable mechanism (for example, a vacuum pump) to selectively engage or disengage the chuck 302. The operational state of vacuum chuck 302 in this regard may be monitored, measured and/or fed-back to the controller 700, for example, via a suitable sensor or detector.

In some embodiments, the degree or angle $\phi$ to which each nozzle 500 is pivoted about its axis 510, the downward angle of the nozzle, the fluid flow rate from the nozzle, and/or other nozzle settings is also controlled and/or monitored by the controller 700. For example, the controller 700 may selectively energize or otherwise regulate operation of a suitable actuator (for example, an electric motor) to pivot each nozzle 500 about its axis 510 between its retracted state or orientation (for example, as shown in FIGS. 2A and 2B) and its operational state or orientation (for example, as shown in FIG. 2C). The state and/or orientation of each nozzle 500 may be monitored, measured and/or fed-back to the controller 700, for example, via a suitable position sensor or the like, such as a rotary encode or the like.

In some embodiments, the selective jetting or spraying of cleaning solution from each nozzle 500 is also controlled and/or monitored by the controller 700. For example, the controller 700 may selectively energize or otherwise regulate operation of a suitable mechanism (for example, a fluid pump) to selectively flow a supplied cleaning solution to and/or through each nozzle 500. It is also contemplated to optionally pulse the pressure as a function of time, either by controlling the fluid pressure to the nozzle using the controller 700 or by a mechanical flow rate modulator device built into the nozzle, to provide pulsed fluid flow that may aid in the cleaning. The operational state of each nozzle 500 in this regard may be monitored, measured and/or fed-back to the controller 700, for example, via a suitable flow rate sensor or the like.

In some embodiments, the selective opening and closing of the drain valve 400 is also controlled and/or monitored by the controller 700. For example, the controller 700 may selectively energize or otherwise regulate operation of a suitable actuator (for example, an electric motor or electromechanical, pneumatic or hydraulic piston) to selectively open and/or close the drain valve 400. The state of the valve 400 may be monitored, measured and/or fed-back to the controller 700, for example, via a suitable sensor or detector. As previously noted, it is alternatively contemplated to omit the drain valve 400 so that the drain is always open (e.g., simply an opening in the trough).

In some suitable embodiments, the controller 700 is programmed to conduct a preset or otherwise determined cleaning routine or process. That is to say, the movement and/or orientation of the nozzles 500, the opening and closing of the drain valve 400, the selective engagement of the vacuum chuck 302 and the selective jetting or spraying of cleaning solution from the nozzles 500 is suitably coordinated and/or directed in accordance with a preset or otherwise determined cleaning process or routine to be applied by the cleaning apparatus 10 under the control of the controller 700 which has been suitably programmed or instructed to carry out the desired cleaning process. In some embodiments, an ad hoc cleaning routine is conducted by the cleaning apparatus 10 under the control and/or regulation of the controller 700. In such instances, an operator may manually enter and/or otherwise input control commands and/or instructions via the user interface 710 to manipulate the cleaning apparatus 10 accordingly as desired.

Figure 4:
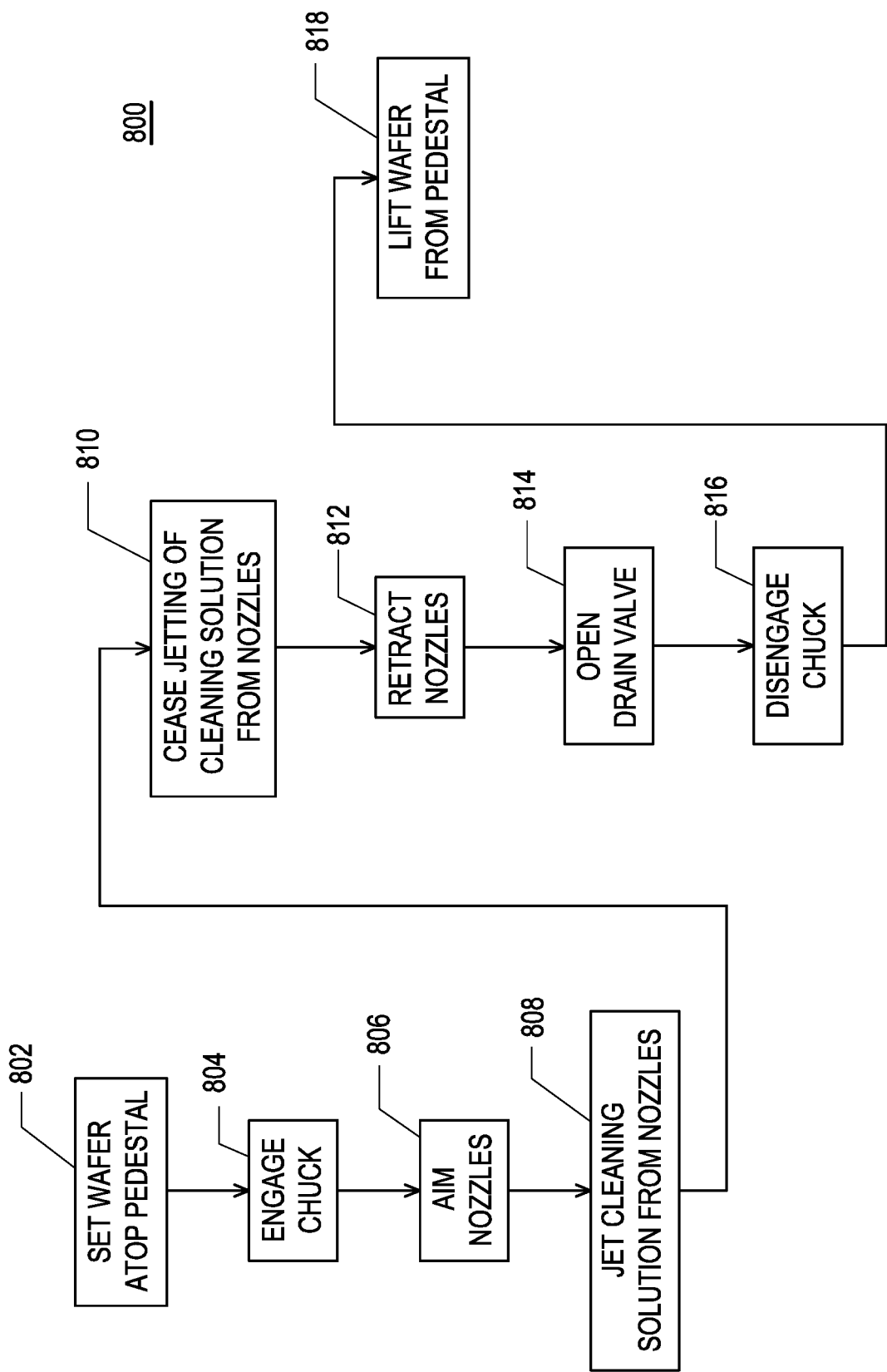
FIG. 4 is a flow chart showing an exemplary cleaning process in accordance with some embodiments disclosed herein, for example, employing the cleaning apparatus shown in FIG. 1.

With reference to FIG. 4, the is shown an exemplary semiconductor wafer cleaning process and/or method 800, for example, conducted with the cleaning apparatus 10 in accordance with some embodiments disclosed herein.

As shown, the cleaning process 800 begins at step 802 with the semiconductor wafer W being loaded into the slim cell 100, for example, from the top down, and placed atop the pedestal 300. Suitably, at this stage of the process (i.e., during step 802), the nozzles 500 are retracted to or otherwise in their initial or non-operational states, for example, as shown in FIGS. 2A and 2B.

At step 804, the pedestal's vacuum chuck 302 is engaged to secure to the semiconductor wafer W to the pedestal 300 where it remains essentially stationary and/or immobile during the remainder of the cleaning process 800 until it is removed from the pedestal 300.

At step 806, each nozzle 500 is pivoted about its respective axis 510 so as to be aimed and/or moved into its respective operational orientation, for example, as shown in FIG. 2C.

While the nozzles 500 are in their respective operational orientations, at step 808, the supplied cleaning solution is flowed to and/or through each nozzle 500 so as to be jetted and/or sprayed from the operational end (e.g., fluid outlet) of the nozzles 500 on and/or over a top surface T of the semiconductor wafer W. After a set or otherwise determined time period, the nozzles 500 cease the jetting and/or spraying of cleaning solution therefrom, as shown at step 810.

As shown, at step 812, the nozzles 500 are pivoted and/or retracted to return to their non-operational orientations and/or states, for example, as shown in FIGS. 2A and 2B. At step 814, the drain valve 410 is opened to allow the cleaning solution collected, retained and/or accumulated in and/or by the slim cell 100 to be drained therefrom via the drain 400. At step 816, the vacuum chuck 302 is disengaged thereby releasing the semiconductor wafer W from the pedestal 300. Suitably, while the steps 812 through 816 are shown in the particular illustrated order, it is to be appreciated that in practice, these steps may be performed simultaneously or substantially concurrently or in any other alternate order of execution.

Having been released from the vacuum chuck 302 and the nozzles 500 having been removed from its way, the cleaned semiconductor wafer W may be lifted, removed and/or picked-up from the pedestal 300, as shown in step 818.

Figure 5:
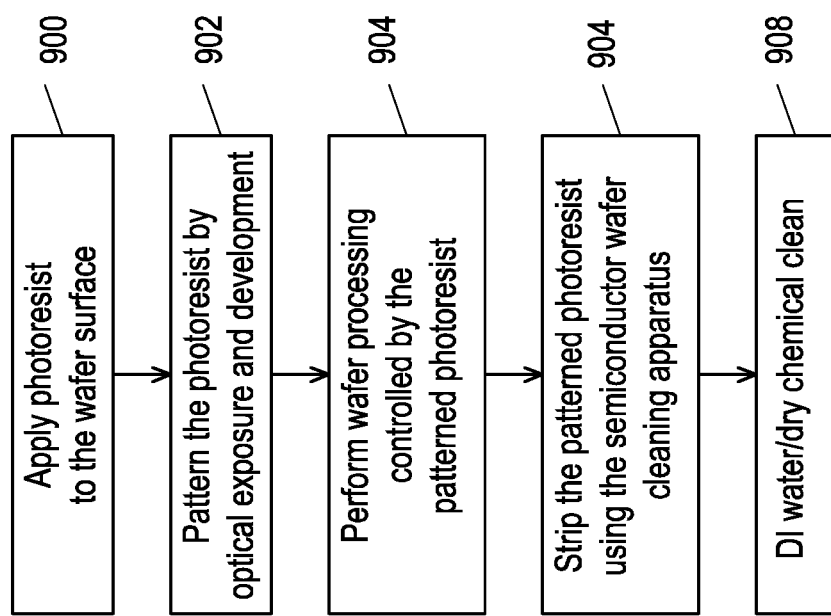
FIG. 5 is a flow chart showing an exemplary semiconductor processing workflow utilizing the cleaning apparatus shown in FIG. 1

With reference to FIG. 5, a nonlimiting illustrative example of one semiconductor processing workflow utilizing a semiconductor wafer cleaning apparatus such as that of FIG. 1 is described. The illustrative semiconductor processing workflow is a photolithographic processing sequence. In an operation 900, a photoresist is applied to the surface of the wafer W. This can be done using a spin-on photoresist application step, for example. In an operation 902, the photoresist is patterned by optical exposure followed by photoresist development. The operation 902 may employ any photoresist exposure/development sequence that is suitable for the chosen photoresist and the critical dimension (CD) size of the features to be patterned. For example, extreme ultraviolet (EUV) exposure may be used for small CD size on the order of nanometers, or deep ultraviolet (DUV) exposure may be used for CD size on the order of tens to hundreds or nanometers, or visible or near-ultraviolet exposure may be used for larger CD sizes, as some nonlimiting illustrative examples. In an operation 904, wafer processing is performed with the processed areas of the semiconductor wafer surface controlled by the patterned photoresist. By way of nonlimiting illustrative example, the operation 904 may include processing steps such as selective etching, selective deposition, selective dopant implantation, various combinations thereof, or so forth, with the choice of processing step(s) and their sequence depending on the desired processing. In an operation 906, the patterned photoresist is stripped, for example using the semiconductor wafer cleaning apparatus of FIG. 1 operated using the cleaning process of FIG. 4 employing a cleaning solution comprising a photoresist stripper that is effective for stripping the photoresist, such as sulfuric acid ($H_2SO_4$) or a Piranha solution. In an operation 908, post-stripping wafer cleaning is performed, for example using DI water, dry chemical cleaning employing methanol ($CH_3OH$) or another solvent, various combinations/sequences thereof, or so forth. The operation 908 may employ a conventional wafer dip in DI water, solvent, or so forth, optionally followed by drying using nitrogen gas, as a nonlimiting illustrative example.

In one variant embodiment, the operation 908 is also performed using the semiconductor wafer cleaning apparatus of FIG. 1. In this variant embodiment, after applying the photoresist stripper (e.g. $H_2SO_4$ or piranha solution) to the wafer surface via the nozzles 500, the fluid supply to the nozzles 500 is switched to the DI water, solvent, or the like used in the operation 908. In such an approach, the semiconductor wafer cleaning apparatus of FIG. 1 can be used to apply a sequence of different cleaning solutions.

In the following, some further illustrative embodiments are described.

In some embodiments, a method of cleaning a semiconductor wafer includes: loading a semiconductor wafer into a cell; moving two or more nozzles into respective operational orientations for spraying onto a top surface of the loaded semiconductor wafer; spraying a cleaning solution from each nozzle among the two or more nozzles onto the top surface of the loaded semiconductor wafer, e.g. in a direction defined by each nozzle's operational orientation such that a patterned flow of cleaning solution is formed on the top surface of the loaded semiconductor wafer. Some embodiments further include collecting the cleaning solution in an annular trough of the cell as the cleaning solution flows off the top surface of the loaded semiconductor wafer.

In some further embodiments, the method includes maintaining the loaded semiconductor wafer stationary during the spraying.

In still additional embodiments, the two or more nozzles includes at least three nozzles.

In some embodiments, the semiconductor wafer prior to the loading has photoresist disposed thereon, the cleaning solution comprises a photoresist stripper, and the method performs photoresist stripping.

In further embodiments, wherein the annular trough has a diameter d1, the semiconductor wafer has a diameter d2, and d1>d2 and $$\frac{d1}{d2} \leq 1.5.$$

In yet further embodiments, the method also includes establishing a liquid-tight seal between a bottom surface of the loaded semiconductor wafer and an inner lip of the annular trough.

In some further embodiments, the direction defined by each nozzle's operational orientation makes an angle with respect to a first line that is tangential to a circumference of the semiconductor wafer at a point where a second line extending along the defined direction intersects the circumference of the semiconductor wafer, and wherein the angle for at least one nozzle is different from the angle for at least one other nozzle.

In yet further embodiments, the spraying of the cleaning solution from each nozzle is in a direction defined by each nozzle's operational orientation such that a rotational patterned flow of cleaning solution is formed on the top surface of the loaded semiconductor wafer is rotational.

In some embodiments, the method further includes selectively opening and closing a valve to selectively drain the collected cleaning solution from the cell.

In some further embodiments, a semiconductor wafer cleaning method includes: securing a semiconductor wafer to a pedestal; spraying a top surface of the semiconductor wafer with a cleaning solution from a plurality of nozzles oriented to produce a rotational flow of the cleaning solution on the top surface of the semiconductor wafer; and collecting the cleaning solution as it flows off the top surface of the semiconductor wafer in an annular trough disposed about a periphery of the semiconductor wafer. Suitably, the semiconductor wafer is maintained stationary during the spraying.

In still further embodiments, each nozzle has an operational end from which the cleaning solution is sprayed and the method further includes, prior to the spraying, moving the plurality of nozzles from non-operational states where their operational ends are not above the top surface of the semiconductor wafer into operational states where their operational ends are positioned above the top surface of the semiconductor wafer.

In yet additional embodiments, the plurality of nozzles includes at least three nozzles.

In some further embodiments, the annular trough has a diameter d1, the semiconductor wafer has a diameter d2, and d1>d2 and $$\frac{d1}{d2} \leq 1.5.$$

In some additional embodiments, the top surface of the semiconductor wafer prior to the securing has photoresist disposed thereon, the cleaning solution comprises a photoresist stripper, and the semiconductor wafer cleaning method is operative to remove the photoresist disposed on the top surface of the semiconductor wafer.

In some embodiments, the method further includes forming a liquid-tight seal between an inner lip of the annular trough and a bottom surface of the semiconductor wafer.

In some embodiments, the annular trough has an outer wall which rises higher than the top surface of the semiconductor wafer when the semiconductor wafer is secured to the pedestal.

In some further embodiments, an apparatus for cleaning a semiconductor wafer includes: an outer housing defining a chamber; a pedestal disposed within the chamber and configured to secure a semiconductor wafer for cleaning; at least three nozzles disposed within the chamber, each nozzle being selectively aimed in a respective direction and selectively spraying a cleaning solution from an operative end of the nozzle in the direction aimed and onto a top surface of the semiconductor wafer secured to the pedestal; and an annular trough disposed within the chamber, the annular trough positioned about a periphery of the semiconductor wafer secured to the pedestal so as to collect the cleaning solution as it flows off the top surface of the semiconductor wafer.

In still further embodiments, the apparatus also includes at least one of an o-ring and a gasket disposed on an upper end of an inner lip of the annular trough, the at least one of the o-ring and the gasket forming a liquid-tight seal between the upper end of the inner lip of the annular trough and a bottom surface of the semiconductor wafer secured to the pedestal.

In yet further embodiments, the semiconductor wafer secured to the pedestal is a non-rotating pedestal that is maintained stationary while cleaning solution is sprayed onto the top surface of the semiconductor wafer from the at least three nozzles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer cleaning apparatus comprising:
an outer housing defining a chamber;
a non-rotatable pedestal disposed within the chamber and configured to secure an associated semiconductor wafer for cleaning, the non-rotatable pedestal not configured to rotate the associated semiconductor wafer secured to the non-rotatable pedestal;
at least three nozzles disposed within the chamber, each nozzle being pivotable about an axis to be aimed in a respective direction and configured to spray an associated cleaning solution from an operative end of the nozzle in the direction aimed and onto a top surface of the associated semiconductor wafer secured to the non-rotatable pedestal; and
an annular trough disposed within the chamber, said annular trough positioned about a periphery of the associated semiconductor wafer secured to the non-rotatable pedestal so as to collect the associated cleaning solution as it flows off the top surface of the associated semiconductor wafer.

2. The apparatus claim 1, further comprising:
at least one of an o-ring and a gasket disposed on an upper end of an inner lip of the annular trough, said at least one of the o-ring and the gasket forming a liquid-tight seal between the upper end of the inner lip of the annular trough and a bottom surface of the associated semiconductor wafer secured to the non-rotatable-pedestal.

3. The apparatus of claim 1, wherein the at least three nozzles are arranged to apply the associated cleaning solution to the top surface of the associated semiconductor wafer secured to the non-rotatable pedestal including to a center of the top surface of the associated semiconductor wafer secured to the non-rotatable pedestal.

4. The apparatus of claim 1, wherein each nozzle is pivotable about the axis from a non-operational angle in which the operative end of the nozzle is not above the top surface of the associated semiconductor wafer secured to the non-rotatable pedestal into an operational angle in which the operative end of the nozzle is positioned above the top surface of the associated semiconductor wafer secured to the non-rotatable pedestal.

5. The apparatus of claim 1, wherein the nozzles are selectively aimed in the respective directions to spray the associated cleaning solution from the operative ends of the respective nozzles collectively create a spinning or whirling pattern on the top surface of the associated semiconductor wafer secured to the non-rotatable pedestal.

6. The apparatus of claim 5, wherein the spinning or whirling pattern of the associated cleaning solution on the top surface of the associated semiconductor wafer secured to the non-rotatable pedestal encompasses a center of the top surface of the associated semiconductor wafer secured to the non-rotatable pedestal.

7. The apparatus of claim 1, wherein:
the respective direction of a first nozzle of the at least three nozzles is at an angle $\phi 1$ with respect to a line tangential to the circumference of the associated semiconductor wafer at a location of the first nozzle;
the respective direction of a second nozzle of the at least three nozzles is at an angle $\phi 2$ with respect to a line tangential to the circumference of the associated semiconductor wafer at a location of the second nozzle, wherein $\phi 1 \neq \phi 2$.

8. The apparatus of claim 7, wherein:
the respective direction of a third nozzle of the at least three nozzles is at an angle $\phi 3$ with respect to a line tangential to the circumference of the associated semiconductor wafer at a location of the third nozzle, wherein $\phi 1 \neq \phi 2 \neq \phi 3$.

9. The apparatus of claim 1, wherein the respective directions of the nozzles of the at least three nozzles are all different.

10. A semiconductor wafer cleaning apparatus comprising:
a chamber;
a non-rotatable pedestal disposed within the chamber, the non-rotatable pedestal not configured to rotate an associated semiconductor wafer secured to the non-rotatable pedestal; and
at least three nozzles disposed within the chamber wherein each nozzle is arranged to spray an associated cleaning solution onto a top surface of the associated semiconductor wafer secured to the non-rotatable pedestal;
wherein the at least three nozzles are arranged to collectively apply the associated cleaning solution to the top surface of the associated semiconductor wafer secured to the non-rotatable pedestal including applying the associated cleaning solution to a center of the top surface of the associated semiconductor wafer secured to the non-rotatable pedestal.

11. The apparatus of claim 10, wherein the at least three nozzles are arranged to collectively create a spinning or whirling pattern of the associated cleaning solution on the top surface of the associated semiconductor wafer secured to the non-rotatable pedestal wherein the spinning or whirling pattern of the associated cleaning solution on the top surface of the associated semiconductor wafer secured to the non-rotatable pedestal that encompasses the center of the top surface of the associated semiconductor wafer secured to the non-rotatable pedestal.

12. The apparatus of claim 10, further comprising:
a trough disposed in the chamber and encircling the non-rotatable pedestal, the trough arranged to collect the associated cleaning solution as it flows off the top surface of the associated semiconductor wafer secured to the non-rotatable pedestal.

13. The apparatus claim 12, further comprising:
at least one of an o-ring and a gasket encircling the non-rotatable pedestal and arranged to form a liquid-tight seal between an inner lip of the trough and a bottom surface of the associated semiconductor wafer secured to the non-rotatable pedestal.

14. The apparatus of claim 10, wherein:
a first nozzle of the at least three nozzles is oriented at an angle $\phi 1$ with respect to a line tangential to the circumference of the associated semiconductor wafer secured to the non-rotatable pedestal at a location of the first nozzle;
a second nozzle of the at least three nozzles is oriented at an angle $\phi 2$ with respect to a line tangential to the circumference of the associated semiconductor wafer secured to the non-rotatable pedestal at a location of the second nozzle; and
a third nozzle of the at least three nozzles is oriented at an angle $\phi 3$ with respect to a line tangential to the circumference of the associated semiconductor wafer secured to the non-rotatable pedestal at a location of the third nozzle;
wherein $\phi 1 \neq \phi 2 \neq \phi 3$.

15. The apparatus of claim 10, wherein each nozzle is pivotable about an axis from (i) a non-operational angle in which the operative end of the nozzle is not above the top surface of the associated semiconductor wafer secured to the non-rotatable pedestal, into (ii) an operational angle in which the nozzle is positioned above the top surface of the associated semiconductor wafer secured to the non-rotatable pedestal and arranged to spray the associated cleaning solution onto the top surface of an associated semiconductor wafer secured to the non-rotatable pedestal.

16. A semiconductor wafer cleaning apparatus comprising:
a chamber;
a non-rotatable pedestal disposed within the chamber, the non-rotatable pedestal not configured to rotate an associated semiconductor wafer secured to the non-rotatable pedestal; and
at least three nozzles disposed within the chamber and arranged to spray an associated cleaning solution onto a top surface of the associated semiconductor wafer secured to the non-rotatable pedestal;
wherein the at least three nozzles are arranged to collectively create a spinning or whirling pattern of the associated cleaning solution on the top surface of the associated semiconductor wafer secured to the non-rotatable pedestal.

17. The apparatus of claim 16 wherein the spinning or whirling pattern of the associated cleaning solution on the top surface of the associated semiconductor wafer secured to the non-rotatable pedestal encompasses a center of the top surface of the associated semiconductor wafer secured to the non-rotatable pedestal.

18. The apparatus of claim 16 wherein the spinning or whirling pattern of the associated cleaning solution on the top surface of the associated semiconductor wafer secured to the non-rotatable pedestal encompasses the entire top surface of the associated semiconductor wafer secured to the non-rotatable pedestal.

19. The apparatus of claim 16, further comprising:
   a trough disposed in the chamber and encircling the non-rotatable pedestal, the trough arranged to collect the associated cleaning solution as it flows off the top surface of the associated semiconductor wafer secured to the non-rotatable pedestal; and
   at least one of an o-ring and a gasket encircling the non-rotatable pedestal and arranged to form a liquid-tight seal between an inner lip of the trough and a bottom surface of the associated semiconductor wafer secured to the non-rotatable pedestal.

20. The apparatus of claim 16, wherein respective directions of the nozzles of the at least three nozzles are all different.

* * * * *